United States Patent
Kay et al.

(10) Patent No.: US 9,601,214 B2
(45) Date of Patent: Mar. 21, 2017

(54) METHOD AND SYSTEM FOR IMPROVING THE RADIATION TOLERANCE OF FLOATING GATE MEMORIES

(71) Applicant: The United States of America as represented by the Secretary of the Navy, Washington, DC (US)

(72) Inventors: Matthew Kay, Jasper, IN (US); James David Ingalls, Bedford, IN (US); Matthew Gadlage, Bloomington, IN (US); Adam Duncan, Bloomington, IN (US); Andrew Howard, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/174,022

(22) Filed: Jun. 6, 2016

(65) Prior Publication Data
US 2016/0284418 A1    Sep. 29, 2016

Related U.S. Application Data

(62) Division of application No. 14/958,202, filed on Dec. 3, 2015, which is a division of application No.
(Continued)

(51) Int. Cl.
*G11C 11/34* (2006.01)
*G11C 16/34* (2006.01)
(Continued)

(52) U.S. Cl.
CPC ............ *G11C 16/349* (2013.01); *G11C 5/005* (2013.01); *G11C 16/0408* (2013.01);
(Continued)

(58) Field of Classification Search
USPC .......................... 365/185.02, 185.32, 185.04
See application file for complete search history.

(56) References Cited

U.S. PATENT DOCUMENTS 5,844,842 A * 12/1998 Seki ....................... G11C 16/06
                                              365/185.24
6,878,991 B1   4/2005 Forbes
(Continued)

*Primary Examiner* — Anthan Tran
(74) *Attorney, Agent, or Firm* — Christopher A. Monsey

(57) ABSTRACT

A method of improving radiation tolerance of floating gate memories is provided herein. Floating gate memories can include a floating gate transistor or a block of floating gate transistors. A floating gate transistor can include a semiconductor region, a source region, a drain region, a floating gate region, a tunnel oxide region, an oxide-nitride-oxide region, and a control gate region. A floating gate transistor or block of floating gate transistors can be written to multiple times in order to accumulate charge on one or more floating gate regions in accordance with an embodiment of the invention. When exposed to radiation, a floating gate region can retain its charge above a certain voltage threshold. A block of floating gate transistors can communicate with an external device where the external device can read a state of the block of floating gate transistors in accordance with an embodiment of the invention.

15 Claims, 8 Drawing Sheets

Related U.S. Application Data

14/502,571, filed on Sep. 30, 2014, now Pat. No. 9,263,139.

(60) Provisional application No. 61/903,626, filed on Nov. 13, 2013.

(51) Int. Cl.

| | |
|---|---|
| *G11C 16/10* | (2006.01) |
| *G11C 5/00* | (2006.01) |
| *G11C 29/50* | (2006.01) |
| *G11C 16/04* | (2006.01) |
| *G11C 16/26* | (2006.01) |

(52) U.S. Cl.
CPC .............. *G11C 16/10* (2013.01); *G11C 16/26* (2013.01); *G11C 29/50004* (2013.01); *G11C 2029/5002* (2013.01)

(56) References Cited

U.S. PATENT DOCUMENTS

| | | | |
|---|---|---|---|
| 7,266,014 B2* | 9/2007 | Wu .................. | G11C 16/18 365/185.01 |
| 7,619,932 B2* | 11/2009 | Jones ................ | G11C 16/3436 365/185.22 |
| 2010/0165738 A1 | 7/2010 | Cernea | |

\* cited by examiner

Step 61 — Determining an electromagnetic interference (EMI)/radiation resistant (EMIRR) charge state threshold of a charge storage system, such as a floating gate transistor, comprising: determining or measuring the EMI/radiation (EMIR) conditions that a charge storing system will be subjected to including enviromental parameters; and determining, based on the EMIR conditions, an EMIRR charge state threshold for the charge storage system, such as floating gate transistor, necessary to prevent charge loss below a predetermined threshold in the charge storage system (e.g., a logical data corruption level).

Step 62 — Providing the charge storing system, such as a floating gate transistor. A floating gate transistor can comprise:
    a semiconductor substrate region;
    a source region and a drain region;
    a control gate region
    a first dielectric insulator region
    (e.g., a tunnel oxide region)
    a second dielectric insulator region
    (e.g., an oxide-nitrate-oxide region);
    and a floating gate region.

Step 63 — Writing, storing, or adding a charge to the charge storing system such as the floating gate transistor. Writing, storing, or adding to the charge storing system, such as the floating gate transistor, can comprise:
    applying a bias in the semiconductor substrate region that includes a tunneling effect so to create a tunneling effect that causes an amount of charge to gather on the floating gate region, wherein the floating gate transistor achieves a conducting or non-conducting state based on a desired operating state, e.g. on/off, "1" or "0".

Fig. 3A

Step 64 — Determining if the charge storage device has achieved the EMIRR charge state threshold; if yes, then continue to next step or terminate EMIRR processing; if no, then repeat step 63 applying a charge adapted to accumulate on the floating gate region that is greater than an amount of charge on the floating gate region that did not achieve the EMIRR charge state threshold.

Step 65 — Irradiating the charge storage system, e.g., a floating gate transistor, at a predetermined EMI or radiation level or at a measured EMI or radiation level associated with the charge storage system in an EMI/radiation enviroment.

Determining if data, e.g., charge representing data, on the charge storage system, e.g., floating gate transistor, is below the EMIRR charge state threshold and/or a predetermined data corruption threshold. If the data is below the EMIRR or predetermined data corruption threshold, then a non-EMI/radiation-resistant state has been achieved. If the data is above a predetermined data corruption threshold, then a radiation-resistant state has been achieved.

Fig. 3B

Step 81: Performing a radiation-induced data corruption threshold test (e.g., as in or in relation to Figure 3) on at least one floating gate transistor, wherein the radiation-induced data corruption threshold test comprises:
  providing a floating gate transistor,
  writing to the floating gate transistor a plurality of times, and determining a radiation-resistant state of the floating gate transistor.

Step 83: Determining operating parameters that achieve a radiation-resistant state (e.g., as discussed in or in relation to Figure 3) based on the radiation-induced data corruption threshold test, wherein the operating parameters can comprise:
  a count of the plurality of times that the floating gate transistor was written to,
  a rate of the plurality of times that the floating gate transistor was written to per unit time,
  a total amount of charge associated with writing to the floating gate transistor the plurality of times,
  an amount of charge associated with each writing to the floating gate transistor operation,
  a radiation threshold, and/or
  a data corruption threshold.

Step 85: Manufacturing a solid state system comprising a plurality of floating gate transistors, wherein manufacturing the solid state system comprises configuring at least one of the plurality of floating gate transistors according to the operating parameters.

Fig. 8

METHOD AND SYSTEM FOR IMPROVING THE RADIATION TOLERANCE OF FLOATING GATE MEMORIES

CROSS-REFERENCE TO RELATED APPLICATIONS

The present application is a divisional of and claims priority to U.S. patent application Ser. No. 14/958,202, filed Dec. 3, 2015, entitled "METHOD AND SYSTEM FOR IMPROVING THE RADIATION TOLERANCE OF FLOATING GATE MEMORIES"; which claims priority to U.S. patent application Ser. No. 14/502,571, filed Sep. 30, 2014, now U.S. Pat. No. 9,263,139, issued Feb. 16, 2016, entitled "METHOD AND SYSTEM FOR IMPROVING THE RADIATION TOLERANCE OF FLOATING GATE MEMORIES" which claims priority to U.S. Provisional Patent Application Ser. No. 61/903,626, filed Nov. 13, 2013, entitled "METHOD FOR IMPROVING THE RADIATION TOLERANCE OF FLOATING GATE MEMORIES," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,363) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The invention generally relates to the field of radiation-hardened solid state data storage and communication systems. In particular, the invention includes a method of improving radiation tolerance of floating gate memories.

BACKGROUND AND SUMMARY OF THE INVENTION

Many semiconductor electronic components are susceptible to radiation damage. Researchers have used radiation hardening to resist damage and malfunctions due to ionizing radiation. Ionizing radiation can be encountered, for example, in outer space, during high-altitude flight, around nuclear reactors, around particle accelerators, during nuclear accidents, and during nuclear warfare. Radiation-hardened components are designed and manufactured to reduce the susceptibility to radiation damage. Due to the extensive development and testing required to produce a radiation-tolerant design of a semiconductor electronic component, radiation-hardened components tend to lag behind the most recent developments.

The radiation sensitivity of floating gate memory technologies is of great interest due to an ever growing need for memory storage. Similar to other electronic components, floating gate devices are affected by exposure to radiation and are susceptible to errors. When floating gate devices are exposed to radiation, a number of errors can occur. Errors, for example, can be when a floating gate device should be read as in a "0" state, but is read as in a "1" state. Other errors can occur, such as non-functioning of a transistor, errors with data communication from one component to another, etc. These errors are sometimes referred to as data corruption. Data corruption within floating gate devices affects their usefulness and severely affects whether floating gate devices can be used in certain environments. The level of radiation a floating gate devices encounters can be measured as a total ionizing dose (TID).

Flash memory is one example of where floating gate devices can be used. Flash memory uses floating gate devices to help achieve an electronic non-volatile computer storage medium. Flash memory can be electrically written to, erased, and reprogrammed. Two types of flash memory can include NAND and NOR architectures. These architectures can comprise floating gate structures.

Various embodiments of the invention provide an improvement to radiation tolerance of solid state data systems including floating gate devices. Exemplary embodiments of the invention can include a variety of methods of operation or use of exemplary systems that include floating gate systems or structures as well as, for example, communication systems and data bus or processing systems.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIGS. 3A and 3B show a flow chart for an example of a method of improving radiation tolerance of a floating gate transistor;

FIG. 8 shows an exemplary method of manufacturing of a system in accordance with one embodiment of the invention;

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
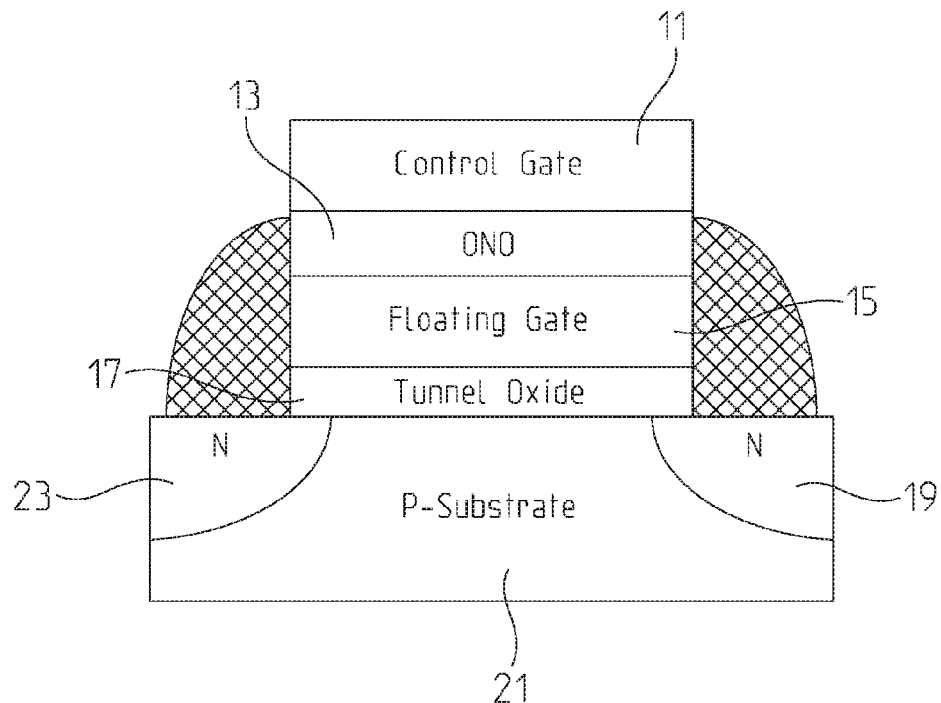
FIG. 1 shows an example of a simplified cross section of a floating gate transistor.

One embodiment of the invention provides a method of improving radiation tolerance of a floating gate transistor. Referring to FIG. 1, the drawing is one example of a simplified cross section of a floating gate transistor. In this example of a floating gate transistor, a semiconductor substrate region 21 is provided. A source region 23 and a drain region 19 can be separated by a semiconductor substrate region 21. A floating gate region 15 is also shown. A floating gate region 15 can be dielectrically separated from a source region 23, a drain region 19, and a semiconductor substrate region 21 by a dielectric insulator region 17, such as a tunnel oxide region. A floating gate region 15 can be dielectrically separated from a control gate region 11 by a dielectric insulator region 13, such as an oxide-nitride-oxide region. A floating gate transistor can comprise other regions and components not shown in FIG. 1, as FIG. 1 is only intended as an example of a simplified cross section of a floating gate transistor.

In one embodiment, a semiconductor substrate region 21 can be a P-substrate material (p-channel). In another embodiment, an N-substrate material (n-channel) can be used for a semiconductor substrate region 21. When a P-substrate material is used, a drain region 19 and a source region 23 can be N-type, and when an N-substrate material is used, a drain region 15 and a source region 23 can be P-type.

An exemplary floating gate region 15 can be dielectrically separated from a drain region 19, a source region 23, and a semiconductor substrate region 21 by a dielectric insulator region 17, such as a tunnel oxide region, and can be dielectrically separated from a control gate region 11 by a dielectric insulator region 13, such as an oxide-nitride-oxide region. Tunneling of charge can occur in a dielectric insulator region 17, such as a tunnel oxide region. Tunneling of electrons onto a floating gate region 15 typically tunnels across a dielectric insulator region 17, such as a tunnel oxide region. The principle of Fowler-Nordheim tunneling of electrons can occur in the transport of electrons across a dielectric insulator region 17, such as a tunnel oxide region, to a floating gate region 15.

Figure 2:
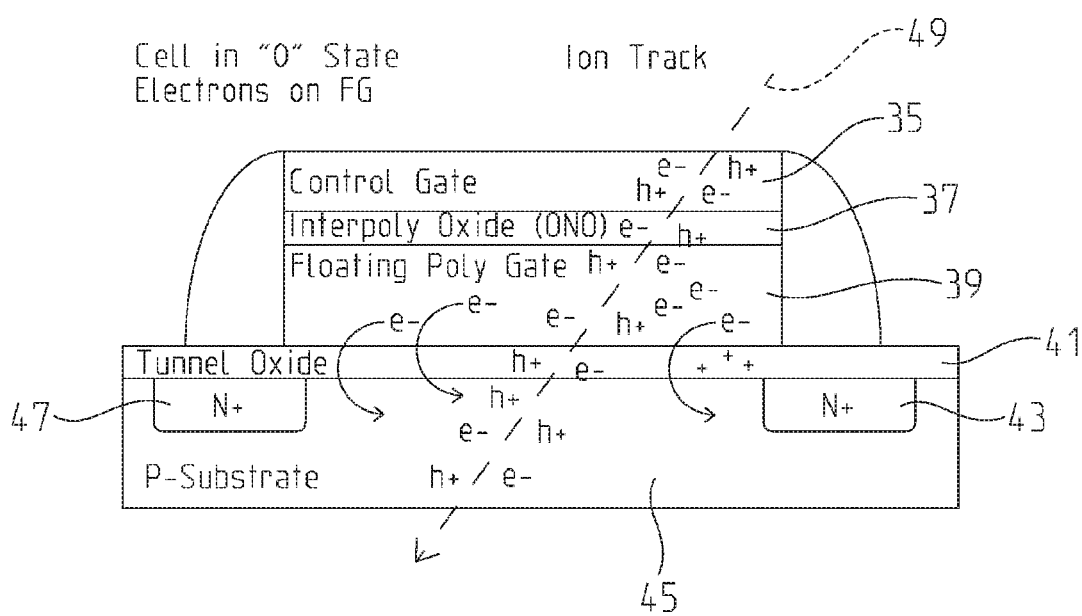
FIG. 2 shows an example of mechanisms of charge removal from a floating gate by electromagnetic fields e.g., radiation effects including ionizing radiation.

FIG. 2 shows one example of a floating gate transistor that may be used with an embodiment of the invention. The exemplary floating gate transistor comprises a semiconductor substrate region 45, a source region 47, a drain region 43, a floating gate region 39, a dielectric insulator region 41, such as a tunnel oxide region, a control gate region 35, and a dielectric insulator region 37, such as an oxide-nitride-oxide region. The drawing shows an example of charge removal from a floating gate transistor. Exemplary radiation, field effects, or electromagnetic effects are represented by dashed line 49 surrounded by the "e-" electrons and "h+" ions. In one example, an initial floating gate transistor state is a "0" state, i.e., enough electrons are on a floating gate region 39 to be above a voltage threshold level. When a floating gate transistor is exposed to radiation, eventually a number of electrons can be removed from a floating gate region 39 by, for example, radiation induced leakage current (RILC) or stress induced leakage current (SILC), resulting in storage charge in, for example, a floating gate, falling below a solid state system (e.g., memory state) voltage threshold level, resulting in the cell state to be erroneously read as, for example, a "1" instead of a "0." SILC and RILC can occur, for example, at a tunnel oxide layer. Interference or effects impacting solid state systems, such as described above to include current leakage, can result in an error and data corruption.

FIGS. 3A and 3B show an exemplary flow chart of a method of improving electromagnetic interference (EMI) or electromagnetic field, e.g., radiation, tolerance of a charge storage device, such as a floating gate transistor. At exemplary step 61, processing will commence by determining an EMI/radiation resistant (EMIRR) charge state threshold of a charge storage system, such as a floating gate transistor, comprising: determining or measuring the EMI/radiation (EMIR) conditions that a charge storing system will be subjected to, including environmental parameters, and determining, based on the EMIR conditions, the EMIRR charge state threshold for the charge storage system, such as a floating gate transistor, necessary to prevent charge loss below a predetermined threshold in the charge storage system (e.g., a logical data corruption level).

An exemplary charge storage device, such as a floating gate transistor, is provided as in step 62. An exemplary floating gate transistor can comprise a semiconductor substrate region, a source region, a drain region, a control gate region, a floating gate region, a first dielectric insulator region (e.g., a tunnel oxide region), and a second dielectric insulator region (e.g., an oxide-nitride-oxide region). A source region and a drain region can be separated by a semiconductor substrate region. A floating gate region can be dielectrically separated from a source region, a drain region, and a semiconductor substrate region by a tunnel oxide region. A floating gate transistor can be dielectrically separated from a control gate region by an oxide-nitride-oxide region.

At step 63, an exemplary system or process continues by writing, storing, or adding a charge to the charge storing system, such as the floating gate transistor. Writing, storing, or adding a charge to the charge storing system, such as the floating gate transistor, can comprise causing a bias in a semiconductor substrate region. Causing a bias in a semiconductor substrate region can induce tunneling effects, where tunneling effects can cause an amount of charge to gather on a floating gate region. A charge can be, e.g., a negative charge, a positive charge, or any other charge. One way to cause charge to be gathered on a floating gate region during tunneling is to apply a voltage to a control gate region. The voltage applied causes charge to tunnel to the floating gate region where charge can remain. Other ways to cause charge to gather on a floating gate region exist, and in no way do these embodiments limit the invention.

In particular, an embodiment of exemplary processing at step 63 can include writing, storing, or adding a charge to the charge storing system such as the floating gate transistor. Writing, storing, or adding to the charge storing system, such as the floating gate transistor, can comprise: applying a bias in the semiconductor substrate region that induces a tunneling effect so to create a tunneling effect that causes an amount of charge to gather on the floating gate region and applying a signal to the floating gate region to add or increase an amount of charge on the floating gate transistor, wherein the floating gate transistor achieves a conducting or non-conducting state based on a desired operating state e.g. on/off, "1" or "0".

Processing at step 64 can include determining if the charge storage device has achieved an EMIRR charge state threshold; if yes, then continue to next step or terminate EMIRR processing; if no, then repeat step 63, applying a charge adapted to accumulate on the floating gate region that is greater than an amount of charge on the floating gate region that did not achieve an EMIRR charge state threshold.

In one example, writing to a floating gate transistor can comprise allowing a floating gate region to gather sufficient charge to be in a "0" or non-conducting state. Whether enough charge is on a floating gate region to be considered a "0" state can depend, for example, on a threshold voltage level. Threshold voltage levels can change with different embodiments of floating gate devices.

In another example, an amount of charge can be facilitated to accumulate on a floating gate region. For example, after a plurality of writes, an amount of charge can accumulate on a floating gate region that is greater than an amount of charge on a floating gate region following only a single write. A single write can put an amount of charge on a floating gate region and a second write can add additional charge to a floating gate region. Further writes can be facilitated to add even more charge. Additional charge on a floating gate region can increase its radiation tolerance.

In step 65, a radiation-resistant state of the charge storage system, e.g., floating gate transistor, can be determined. In one example, a radiation threshold for a floating gate transistor associated with a predetermined charge loss or data corruption attribute can be predetermined based on a desired environment. A floating gate transistor can be irradiated at a predetermined radiation threshold to determine if it has achieved a radiation resistant state. Also in step 65, whether a data on a floating gate transistor is below a predetermined data corruption threshold can be determined. Data, for example, can be charge on a floating gate transistor. In one example, if data is below a predetermined data corruption threshold, then a radiation-resistant state has not been achieved. In another example, if data is above a predetermined data corruption threshold, then a radiation-resistant state has been achieved.

In particular, an exemplary processing at step 65 can include irradiating a charge storage system, e.g., a floating gate transistor, at a predetermined EMI or radiation level or at a measured EMI or radiation level associated with the charge storage system in an EMI/radiation environment and then determining if data, e.g., charge representing data, on the charge storage system, e.g., floating gate transistor, is below the EMIRR charge state threshold and/or a predetermined data corruption threshold. If the data is below the EMIRR or predetermined data corruption threshold, then a non-EMI/radiation-resistant state has been achieved. If data is above a predetermined data corruption threshold, then a radiation-resistant state has been achieved.

An electronic (e.g., FPGA or microcontroller) or computer implemented system for executing processing in accordance with the invention can also be provided. The electronic system or computer implemented system can be programmed, designed to execute or include a plurality of machine interpretable processing sequences adapted to perform processing of the method as described, for example, in FIGS. 3A and 3B. Such a system could include a storage system adapted to store the processing sequences, an input/output system, a measuring system adapted to measure the EMIR and provide data on the EMIR conditions as discussed above, a section adapted to provide EMI or radiation environments such as discussed above in step 65, and a charge storage system such as discussed above. A user interface can also be provided as well as a monitoring system which could include alerts or data outputs. Such a system can either be used in a test environment or it can be used in a fielded system which is continuously monitoring an EMIR environment of the charge storage system and continuously adapting its processing in order to ensure that the system is EMIR resistant such as ensuring the EMIRR charge state threshold is continuously updated and maintained. Such applications could be used in, for example, space systems, etc.

In one embodiment, a system is provided which comprises a control section comprising a non-transitory storage medium. This storage medium can be adapted to store machine-readable instructions. The system can also comprise one or more sections that are adapted to read machine-readable instructions.

For example, at least one of these sections can be adapted to write to a floating gate transistor a plurality of times as discussed above. Such a section can also be adapted to write to remove charge from a floating gate transistor and rewrite to a floating gate transistor with an increase in a number of plurality of writes. Also, for example, at least one of these sections can be adapted to irradiate a floating gate transistor at a predetermined radiation threshold. This predetermined radiation threshold can be based on a desired environment. Also, for example, at least one of these sections can be adapted to determine if data on a floating gate transistor is above or below a predetermined data corruption threshold. Data, for example, can be charge on a floating gate transistor. In one example, if data is below a predetermined data corruption threshold, then a radiation-resistant state has not been achieved. In another example, if data is above a predetermined data corruption threshold, then a radiation-resistant state has been achieved.

In one embodiment, the section discussed above adapted to write to a floating gate transistor can be adapted to, for example, apply a bias in a semiconductor substrate region of the floating gate transistor that induces a tunneling effect that causes an amount of charge to gather on a floating gate region of the floating gate transistor. Such a charge can cause, for example, the floating gate transistor to be in a non-conducting state. Also, the section discussed above adapted to write to a floating gate transistor can be adapted to, for example, apply a signal to a floating gate region of the floating gate transistor that increases the amount of charge on the floating gate region, thus causing the floating gate transistor to be in a non-conducting state. Also, the section discussed above adapted to write to a floating gate transistor can be adapted to, for example, apply a charge adapted to write to a floating gate transistor a plurality of times and thus cause a charge to accumulate on a floating gate region of a floating gate transistor that is greater than the amount of charge caused to accumulate on a floating gate region of a floating gate transistor by a single write.

Figure 4:
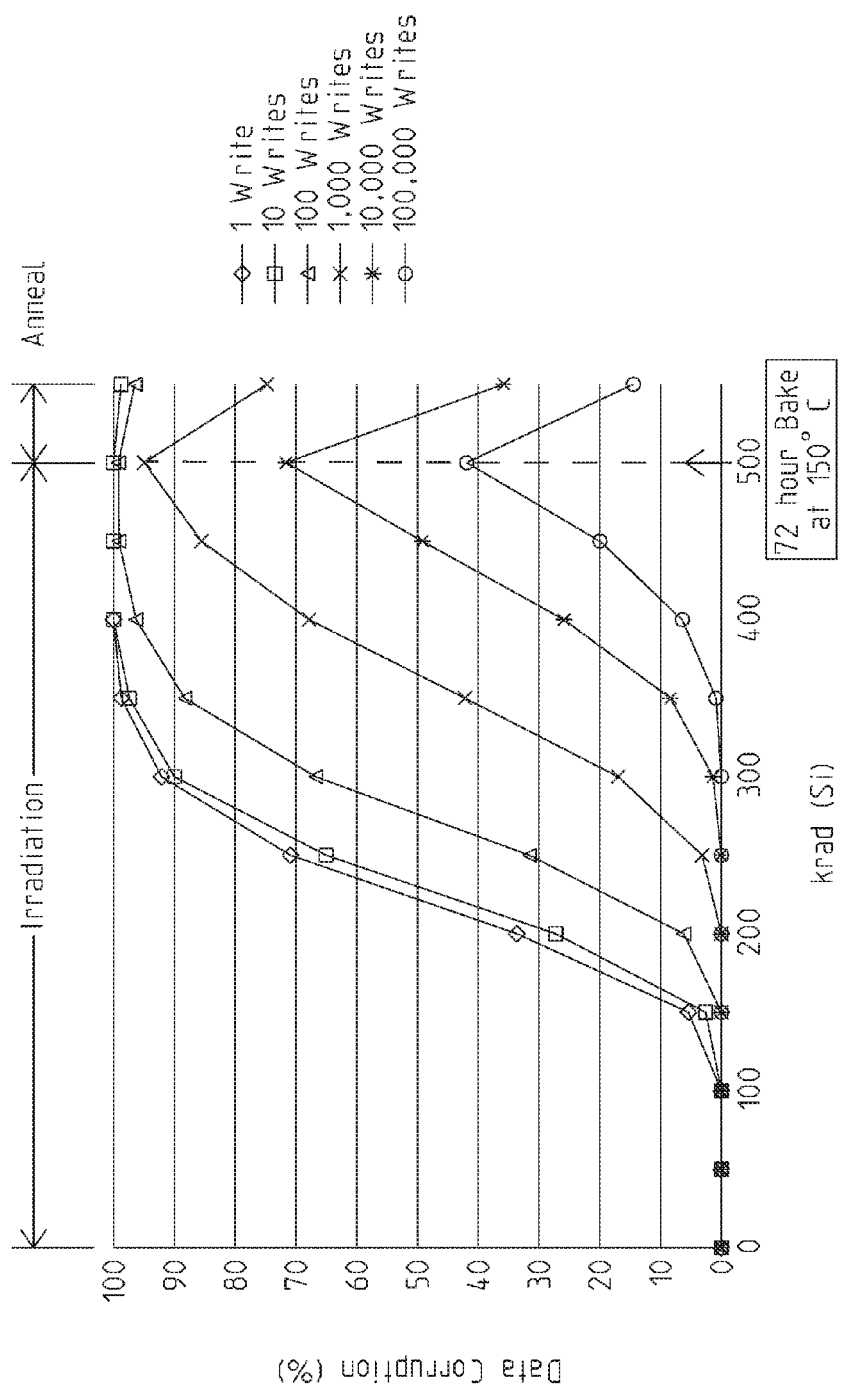
FIG. 4 shows test results from an exemplary floating gate device, test results showing percent data corruption vs. total ionizing dose for varying number of writes for solid "0" pattern.

FIG. 4 shows test results from an exemplary charge storage system, such as a floating gate device, including test results showing percent data corruption vs. total ionizing dose for varying number of writes for solid "0" pattern. A floating gate device can be written in many ways, including, for example, a solid "0" pattern, a solid "1" pattern, checkerboard, etc. Writing can depend on page number, location of bit storage, etc. The radiation level on the horizontal axis is given in krad(Si). Radiation levels can represent a radiation threshold value desired. The data corruption percentage is represented on the vertical axis. Different radiation levels and data corruption levels can be seen by the curves on the graph. The various curves represent 1, 10, 100, 1000, 10000, and 100000 writes. The more writes, the further right on the graph the curve is. This shows that more writes to a floating gate transistor results in increased charge on the floating gate region of the floating gate transistor, which requires increased radiation to achieve the same data corruption that could be achieved by less radiation were fewer writes performed. Stated differently, a first floating gate transistor that is written to more times than a second floating gate transistor will experience less data corruption than the second floating gate if the first floating gate transistor and the second floating gate transistor are subjected to the same level of radiation for the same amount of time. The graph shows that higher levels of radiation are associated with higher data corruption percentage levels, which is true for all writes. A user can determine a radiation threshold and see what the percentage data corruption would be for the radiation threshold level.

Figure 5:
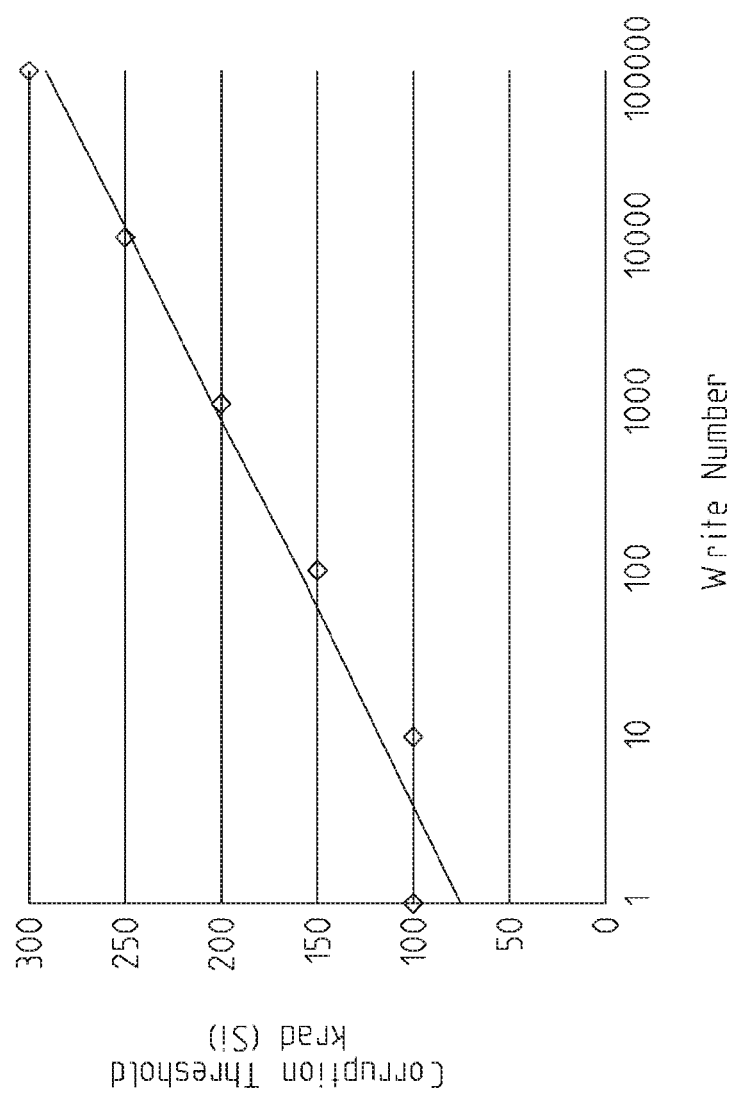
FIG. 5 shows test results from an exemplary floating gate device, test results showing corruption threshold (in krad (Si)) vs. the number of writes.

FIG. 5 shows test results from a charge storage system, e.g., an exemplary floating gate device, including test results showing corruption threshold (in krad(Si)) vs. the number of writes. The test results further show write number on the horizontal axis and the data corruption thresholds on the vertical axis. A number of writes, for example, can be written to a floating gate region of a floating gate transistor. This graph gives approximate values of radiation thresholds for number of writes to a floating gate transistor. For example, if a user desires a radiation threshold of 200 krad(Si), the user can see from the exemplary graph that this would take 1000 writes to a floating gate transistor. This graph shows that increasing the number of writes to a floating gate transistor increases the corruption threshold of the floating gate transistor.

Figure 6:
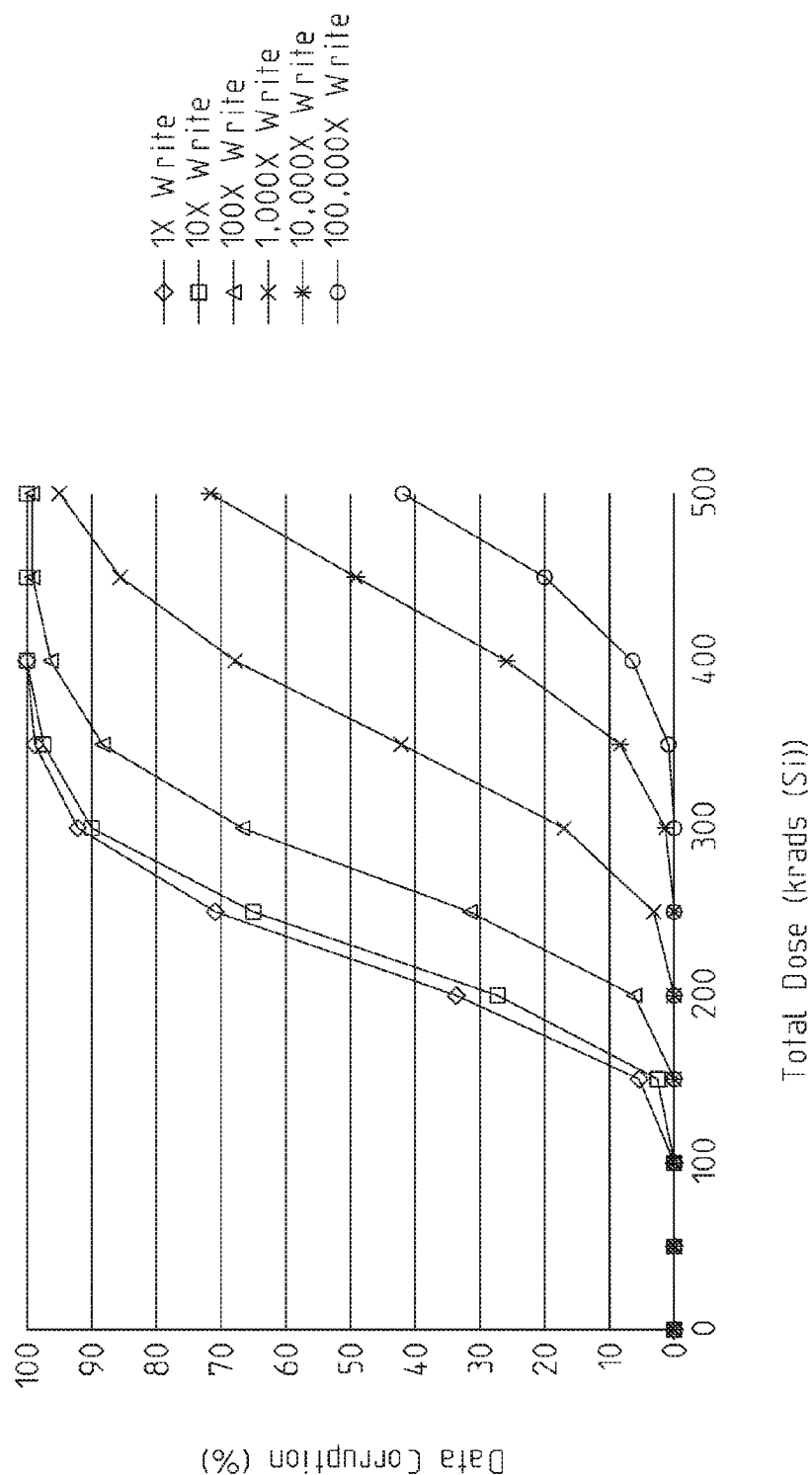
FIG. 6 shows test results from an exemplary floating gate device, test results showing percent data corruption vs. total ionizing dose for varying numbers of writes for a 60 nm flash device.

FIG. 6 shows test results from an exemplary charge storage system, e.g., floating gate device, including test results showing percent data corruption vs. total ionizing dose for varying numbers of writes for a 60 nm flash device. The total dose radiation level on the horizontal axis is given in krad(Si). Radiation levels can represent a radiation threshold value desired. The data corruption percentage is represented on the vertical axis. Different radiation levels and data corruption levels can be seen by the curves on the graph. The various curves represent 1, 10, 100, 1000, 10000, and 100000 writes. The more writes, the further right on the graph the curve is. This shows that more writes to a floating gate transistor results in increased charge on the floating gate transistor, which requires increased radiation to achieve the same data corruption that could be achieved by less radiation were fewer writes performed. Stated differently, a first floating gate transistor that is written to more times than a second floating gate transistor will experience less data corruption than the second floating gate if the first floating gate transistor and the second floating gate transistor are subjected to the same level of radiation for the same amount of time. The graph shows that as the level of radiation increases, the higher the data corruption percentage levels, which is true for all writes. A user can determine a radiation threshold and see what the percentage data corruption would be for the radiation threshold level.

Figure 7:
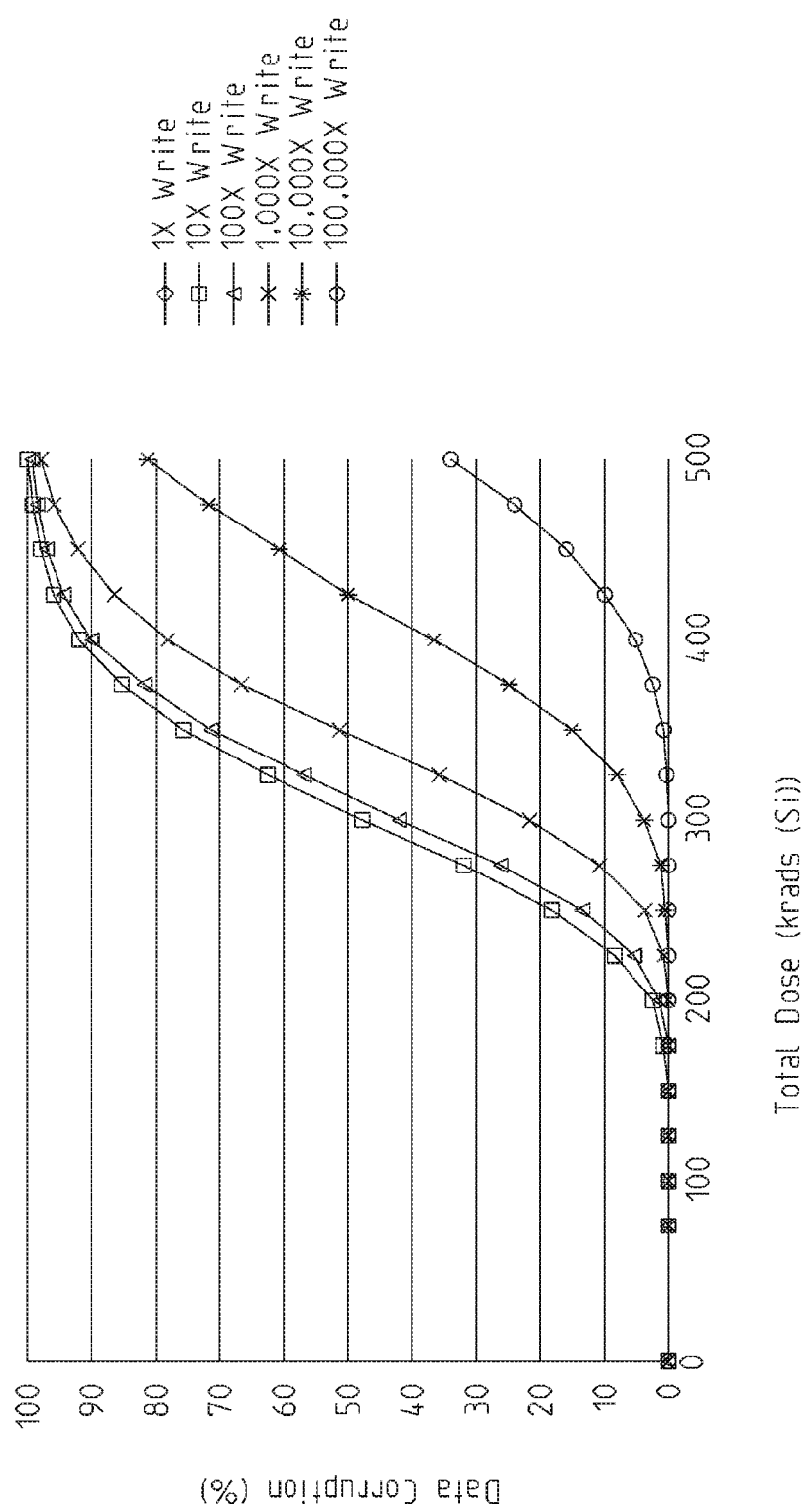
FIG. 7 shows test results from an exemplary floating gate device, test results showing percent data corruption vs. total ionizing dose for varying numbers of writes for a 42 nm flash device.

FIG. 7 shows test results from an exemplary charge storage system, e.g., a floating gate device, test results showing percent data corruption vs. total ionizing dose for varying numbers of writes for a 42 nm flash device. The total dose radiation level on the horizontal axis is given in krad(Si). Radiation levels can represent a radiation threshold value desired. The data corruption percentage is represented on the vertical axis. Different radiation levels and data corruption levels can be seen by the curves on the graph. The various curves represent 1, 10, 100, 1000, 10000, and 100000 writes. The more writes, the further right on the graph the curve is. This shows that more writes to a floating gate transistor results in increased charge on the floating gate transistor, which requires increased radiation to achieve the same data corruption that could be achieved by less radiation were fewer writes performed. Stated differently, a first floating gate transistor that is written to more times than a second floating gate transistor will experience less data corruption than the second floating gate if the first floating gate transistor and the second floating gate transistor are subjected to the same level of radiation for the same amount of time. The graph shows that as the level of radiation increases, the higher the data corruption percentage levels, which is true for all writes. A user can determine a radiation threshold and see what the percentage data corruption would be for the radiation threshold level.

FIG. 8 shows an exemplary flow chart of a method of manufacturing a solid state system of floating gate transistors with improved electromagnetic interference (EMI) or electromagnetic field, e.g., radiation, tolerance. At exemplary step 81, a radiation induced data corruption threshold test can be performed on at least one floating gate transistor. The radiation induced data corruption threshold test can include, for example, one of the methods discussed in this application, such as the method exemplified by FIGS. 3A and 3B. For example, the radiation-induced data corruption threshold test can comprise: providing a floating gate transistor, writing to the floating gate transistor a plurality of times, and determining a radiation-resistant state of the floating gate transistor. At exemplary step 83, operating parameters that achieve a radiation-resistant state can be determined based on a radiation-induced data corruption threshold test. The operating parameters can comprise a count of a plurality of times that a floating gate transistor is written to, a rate of a plurality of times that a floating gate transistor is written to per unit time, a total amount of charge associated with writing to a floating gate transistor a plurality of times, an amount of charge associated with each writing operation when a floating gate transistor is written to a plurality of times, a radiation threshold at which a floating gate transistor was irradiated, and/or a data corruption threshold. At exemplary step 85, a solid state system can be manufactured. The solid state system can comprise a plurality of floating gate transistors. Manufacturing the solid state system can comprise configuring at least one of the floating gate transistors of the solid state system according to the operating parameters.

One example of a floating gate memory device is an 8 Gb NAND flash memory device. This type of flash memory device can comprise a plurality of floating gate transistors. A single floating gate transistor can be read as a bitcell. A bitcell can be read, for example, as a "0" or a "1." A bitcell value of "0" can be associated with a non-conducting state where enough electrons have accumulated on a floating gate region to be above a threshold voltage level ("on" state). A bitcell value of "1" can be associated with a conducting state where insufficient electrons are on a floating gate region, causing charge on a floating gate region to be below a threshold voltage level ("off" state). A threshold voltage, for example, can be a value of a gate-source voltage when a conducting channel just begins to connect the source and drain contacts of a floating gate transistor; connecting the source and drain contacts across a conducting channel allows significant current to flow.

In one embodiment, a floating gate transistor can accumulate charge on a floating gate region, i.e., become "written." Charge can be accumulated on a floating gate region by writing to a floating gate transistor, i.e., to a floating gate region. Writing to a floating gate transistor can involve facilitating current flow across a conducting channel, e.g., a semiconductor substrate region, while a control gate voltage is high (above a certain threshold). Facilitating current flow across a semiconductor substrate region can be achieved in multiple ways, e.g., Fowler-Nordheim tunneling, hot-carrier injection, etc. When writing to a floating gate transistor, a certain amount of charge can be accumulated on a floating gate region. After a single write, another write can be written to a floating gate region, which accumulates even more charge on the floating gate region. A floating gate transistor can continue to be written to accumulate even more charge.

In another example, charge on a floating gate region of a floating gate transistor can be taken off of the floating gate region, i.e., be "erased." Erasing a floating gate transistor can involve facilitating current flow across a conducting channel, e.g., a semiconductor substrate region, while a control gate voltage is low (below a certain threshold). Following a floating gate transistor being erased, a floating gate transistor can be written to, accumulating charge on a floating gate region.

In another embodiment, a floating gate transistor can be written to a plurality of times, accumulating an amount of charge on a floating gate region greater than an amount of charge that a single write could produce. By accumulating an amount of charge on a floating gate region that is greater than an amount of charge from a single write, a floating gate transistor can have improved radiation tolerance. For example, when a gamma ray radiation source (e.g., Co-60) comes into contact with a floating gate transistor, a certain amount of charge is sometimes removed from a floating gate region of a floating gate transistor. Accumulating an amount of charge on a floating gate region with a plurality of writes improves a floating gate transistor's radiation tolerance. Thus, when a multiple-write floating gate transistor is exposed to a radiation source, it is much less likely to lose its charge (losing an amount of charge falling below a voltage threshold) compared to a single-write floating gate transistor, which has less charge built up on its floating gate region.

In another embodiment, a signal is applied to a floating gate region to increase an amount of charge on a floating gate region. For example, an amount of charge on a floating gate region can cause said floating gate transistor to be in a non-conducting state.

A data corruption threshold can be determined by exposing a floating gate transistor to radiation, causing a floating gate transistor to lose charge from its floating gate region. A data corruption threshold can be defined as a lowest total ionizing dose (TID) value at which data in a floating gate transistor becomes corrupted. One example of data corruption in a floating gate transistor is when a floating gate transistor transitions from a "0" state to a "1" state when exposed to radiation, i.e., when a floating gate region loses enough charge to fall below a floating gate transistor's voltage threshold, which recognizes little or no charge on a floating gate region.

In one embodiment, a radiation-resistant state of a floating gate transistor can be determined. A predetermined radiation threshold for a floating gate transistor can be decided, for example, based on a desired environment in which a floating gate transistor will be exposed. Other considerations may be given to determine a predetermined radiation threshold. In another example, a floating gate transistor is irradiated at a predetermined radiation threshold. A floating gate transistor can be exposed for any duration. A duration can be considered, for example, based on the possible environments a floating gate transistor may be exposed.

In another example, a determination may be made as to whether data or charge on a floating gate transistor is below a predetermined corruption threshold. Data, for example, can be charge on a floating gate transistor. In one embodiment, if data on a floating gate transistor is below a predetermined data corruption threshold, then a radiation-resistant state has not been achieved. In another embodiment, if data on a floating gate transistor is above a predetermined data corruption threshold, then a radiation-resistant state has been achieved. If a radiation-resistant state has not been achieved, charge from a floating gate region can be removed and rewritten a plurality of times with an increase in a number of plurality of writes compared to a previous number of plurality of writes.

In another example, when a floating gate transistor is written to, the writes can be consecutive writes, i.e., one write after another write. Consecutive writes can accomplish adding charge to a floating gate region. In one example, a floating gate region can be a semiconductor or metal material. A semiconductor or metal material can hold charge on a floating gate region and allow charge to accumulate. In another example, accumulated charge can remain on a floating gate region during intermittent writes, during tunneling effect, or when tunneling effect ceases. In one embodiment, a floating gate transistor can be manufactured from radiation-hardened materials. In one embodiment, a material is radiation-hardened if the material's performance is not degraded as a result of irradiation of the material.

In another embodiment, a method of improving radiation tolerance of a block of floating gate transistors is contemplated. A block of floating gate transistors can include two NAND strings, each NAND string including 32 floating gate transistors, and each floating gate transistor representing different pages. In one example, a block of floating gate transistors can be provided, each floating gate transistor within a block of floating gate transistors includes a semiconductor substrate region, a source and a drain region, a floating gate region, a first dielectric insulator region (e.g., a tunnel oxide region), a second dielectric insulator region (e.g., an oxide-nitride-oxide region), and a control gate region.

In one embodiment, a block of floating gate transistors can be written a plurality of times. Writing a plurality of times can be consecutive. Writing can include causing a bias in at least one semiconductor substrate region of a block of floating gate transistors, which may induce a tunneling effect causing an amount of charge to gather on an associated floating gate region. In another example, a floating gate region can accumulate sufficient charge to be in a non-conducting state. A sufficient charge can be any charge over a voltage threshold. A voltage threshold may depend on the specifications of a device, the materials used for a device, the size of a transistor, etc. In one embodiment, an amount of charge can gather on at least one floating gate region that is greater than an amount of charge on a floating gate region from a single write, i.e., a floating gate region may be written several times to accumulate more charge than a single write could produce.

In another example, when a block of floating gate transistors is written to, the writes can be consecutive writes, i.e., one write after another write. Consecutive writes can accomplish adding charge to at least one floating gate region. In one example, a floating gate region can be a semiconductor or metal material. A semiconductor or metal material can hold charge on a floating gate region and allow charge to accumulate. In another example, accumulated charge can remain on an associated floating gate region during intermittent writes, during tunneling effect, or when tunneling effect ceases. In another embodiment, a sufficient charge on a floating gate, where a sufficient charge is greater than a voltage threshold, can cause a floating gate transistor to be in a non-conducting state. Writing to a block of floating gate transistors a plurality of times can include, for example, applying voltages to at least one control gate region during tunneling effects.

In one embodiment, a floating gate transistor can be manufactured from radiation-hardened materials. A material and/or structural aspect of a material can be considered radiation-hardened if the material has one or more electrical performance characteristics that are not degraded as a result of irradiation of the material. When writing to a block of floating gate transistors a plurality of times, the writing can be consecutive writes. Consecutive writes can accumulate charge on floating gate regions.

In one example, a radiation-resistant state of a block of floating gate transistors can be determined. A radiation-resistant state, for example, can be determined by predetermining a radiation threshold for a block of floating gate transistors based on a desired environment, irradiating a block of floating gate transistors at a predetermined radiation threshold, and determining if data, e.g., charge representing data, on a block of floating gate transistors is below a predetermined data corruption threshold. In another example, if data on a block of floating gate transistors is below a predetermined threshold, then a radiation-resistant state has not been achieved. In another example, if data on a block of floating gate transistors is above a predetermined data corruption threshold, then a radiation-resistant state has been achieved. In one embodiment, if a radiation-resistant state has not been achieved, then charge from a floating gate region is removed and a block of floating gate transistors is rewritten a plurality of times with an increase in a number of plurality of writes. Data, for example, can be charge on a floating gate region or a block of floating gate regions.

In one embodiment, a floating gate transistor or block of floating gate transistors communicates with an external device. Exemplary external devices could include computers, machines, other blocks of floating gate transistors, other memory storage devices, etc. A state of at least one floating gate transistor from a block of floating gate transistors can be determined. A state could be, for example, a "0" state or a "1" state. A state can be determined, for example, by determining if an amount of charge is above a voltage threshold, where a voltage threshold can depend on the characteristics of floating gate transistors, a block of floating gate transistors, an external device, other devices connected, etc.

In another example, a bit can be sent along an electrical path to an external device. A bit could also be received along an electrical path from an external device. A bit can be information in any form, e.g., a "0" state, a "1" state, a high voltage, a low voltage, multiple states combined, etc.

In one example, an external device can be connected electrically or mechanically to a block of floating gate transistors. A connection could be physical or non-physical. Examples of non-physical connections may include wireless communications to an external device and other forms of non-physical communication. A physical connection could include USB port connections into a computer, any device connected to a block of floating gate transistors, and other forms of physical connections. In another embodiment, sending or receiving a bit along an electrical path to or from an external device does not change an amount of charge accumulated on a floating gate region.

This invention also contemplates a method of maintaining the radiation tolerance of a floating gate transistor in an environment where EMI/radiation conditions exist. For example, such a method can comprise detecting or measuring an EMI/radiation condition and updating a process for improving a floating gate transistor's radiation tolerance accordingly.

An exemplary system can be directed to dynamic operation in accordance with an embodiment of the invention directed to a rate or number of writes per unit of time. In one embodiment, a floating gate transistor can be in an environment and can be written to according to an embodiment, e.g., a method(s) discussed above, in order to improve the floating gate transistor's radiation tolerance. Such a floating gate transistor can be written to at a particular rate (e.g., number of writing operations per unit time) that causes the floating gate transistor to be in a radiation resistant state associated with a first radiation tolerance threshold. A first radiation tolerance threshold can be set to a particular level or range of radiation. Then, an EMI/radiation condition can be detected in the environment and can be measured. This EMI/radiation condition can be higher than a level or range of radiation associated with a first radiation tolerance threshold. A detected or measured EMI/radiation condition can be associated with a second radiation tolerance threshold, and the rate at which the floating gate transistor is written to can be updated based on the second radiation tolerance threshold. For example, a floating gate transistor can be written to an increased number of times per unit time based on a second radiation tolerance threshold being higher than a first radiation tolerance threshold upon determination that the EMI/radiation condition has been encountered using, e.g. a sensor and control system.

In another embodiment, a floating gate transistor can be in an environment and can be written to according to the method discussed above in order to improve the floating gate transistor's radiation tolerance directed to amount of charge per write operation. Such a floating gate transistor can be written to such that each writing operation accumulates an amount of charge or a range of amount of charge that causes the floating gate transistor to be in a radiation resistant state associated with a first radiation tolerance threshold. A first radiation tolerance threshold can be set to a particular level or range of radiation. Then, an EMI/radiation condition can be detected in the environment and can be measured. This EMI/radiation condition can be higher than a level or range of radiation associated with a first radiation tolerance threshold. A detected or measured EMI/radiation condition can be associated with a second radiation tolerance threshold, and the amount of charge or the range of amount of charge accumulated to the floating gate transistor per writing operation can be updated based on the second radiation tolerance threshold. For example, a floating gate transistor can be written to with increased charge per writing operation based on a second radiation tolerance threshold being higher than a first radiation tolerance threshold.

In another embodiment, a radiation detection section detects radiation and makes adjustments to write processing such as described herein. For example, a radiation detection can occur and then a controller can alter radiation tolerance processing adjustments to a charge storage system. In one embodiment, a data store can be provided on a radiation-protected section or medium (e.g., optical storage) which provides configuration data associated with a detected radiation level which then adjusts radiation tolerance protocols such as described herein.

Another embodiment can include a radiation-hardened memory backup which receives duplicate data from a non-radiation-hardened charge storage system. When radiation is detected, a radiation-hardened section can be activated that operates until the radiation tolerance adjustments are made, and then the non-radiation-hardened system can be deactivated as radiation tolerance has been achieved for the non-radiation-hardened charged storage device. Some or all of the non-radiation-hardened charge storage system can be copied to the radiation-hardened charge storage system, e.g. registers for processor operation, one or more sections of a non-volatile random access memory (RAM), etc.

Although the invention has been described in detail with reference to certain preferred embodiments, variations and modifications exist within the spirit and scope of the invention as described and defined in the following claims.

What is claimed is:

1. A method of improving radiation tolerance of a block of floating gate transistors comprising:
   providing a block of floating gate transistors, each floating gate transistor within said block of floating gate transistors comprising:
      a semiconductor substrate region;
      a source region and a drain region separated by said semiconductor substrate region; and
      a floating gate region,
      wherein said floating gate region is dielectrically separated from said source region, said drain region, and said semiconductor substrate region by a first dielectric insulator region,
      wherein said floating gate region is dielectrically separated from a control gate region by a second dielectric insulator region;
   writing to said block of floating gate transistors a plurality of times, each of said writing to said floating gate transistor operations comprising:
      applying a bias in at least one of said semiconductor substrate regions of said block of floating gate transistors that induces a tunneling effect, said tunneling effect causing an amount of charge to gather on associated floating gate regions; and
   determining a radiation-resistant state of said block of floating gate transistors comprising:
      predetermining a radiation threshold for said block of floating gate transistors based on a desired environment;
      irradiating said block of floating gate transistors at said predetermined radiation threshold; and
      determining if data on said block of floating gate transistors is below a predetermined data corruption threshold,
      wherein if said data on said block of floating gate transistors is below a predetermined data corruption threshold, then said radiation-resistant state has been achieved,
      wherein if said data on said block of floating gate transistors is above a predetermined data corruption threshold, then said radiation-resistant state has not been achieved.

2. The method of improving radiation tolerance of a block of floating gate transistors of claim 1, wherein said floating gate regions are adapted to accumulate sufficient charge to be in a non-conducting state.

3. The method of improving radiation tolerance of a block of floating gate transistors of claim 1, wherein if said radiation-resistant state has not been achieved, then charge from said floating gate regions is removed and said writing to said block of floating gate transistors said plurality of times is performed again with an increase in a number of said plurality of writes.

4. The method of improving radiation tolerance of a block of floating gate transistors of claim 1, wherein said writing to said block of floating gate transistors said plurality of times is performed consecutively.

5. The method of improving radiation tolerance of a block of floating gate transistors of claim 1, wherein said floating gate region comprises a semiconductor or metal material.

6. The method of improving radiation tolerance of a block of floating gate transistors of claim 1, wherein said amount of charge remains on said associated floating gate regions when said tunneling effect ceases.

7. The method of improving radiation tolerance of a block of floating gate transistors of claim 1, wherein said sufficient charge to be in said non-conducting state is charge that is greater than a voltage threshold.

8. The method of improving radiation tolerance of a block of floating gate transistors of claim 1, wherein said writing to said block of floating gate transistors said plurality of times comprises applying voltages to at least one of said control gate regions during said tunneling effect.

9. The method of improving radiation tolerance of a block of floating gate transistors of claim 1, wherein said floating gate transistors are manufactured from radiation-hardened materials.

10. The method of improving radiation tolerance of a block of floating gate transistors of claim 1, wherein said method comprises:
   communicating with an external device from at least one of said floating gate transistors, said step of communicating with an external device comprising:
      determining a state of at least one of said floating gate transistors from said block of floating gate transistors; and
      sending or receiving a bit signal derived from said determining said state of at least one of said floating gate transistors along an electrical path to or from said external device.

11. The method of improving radiation tolerance of a block of floating gate transistors of claim 10, wherein said external device is electrically or mechanically connected to said block of floating gate transistors.

12. The method of improving radiation tolerance of a block of floating gate transistors of claim 10, wherein said determining said state of at least one of said floating gate transistors from said block of floating gate transistors comprises determining whether said amount of charge on said floating gate regions is above a voltage threshold.

13. The method of improving radiation tolerance of a block of floating gate transistors of claim 10, wherein said bit is either a logical "1" or "0".

14. The method of improving radiation tolerance of a block of floating gate transistors of claim 10, wherein said sending or receiving a bit along an electrical path to or from said external device does not change said amount of charge accumulated on said floating gate regions.

15. The method of improving radiation tolerance of a block of floating gate transistors of claim 10, wherein said writing to said block of floating gate transistors said plurality of times is performed consecutively.

* * * * *